(12) United States Patent
Kawamura et al.

(10) Patent No.: US 8,968,017 B2
(45) Date of Patent: Mar. 3, 2015

(54) SEMICONDUCTOR DEVICE AND METHOD FOR MANUFACTURING THE SAME

(71) Applicant: Kabushiki Kaisha Toshiba, Minato-ku (JP)

(72) Inventors: Keiko Kawamura, Kanagaea-ken (JP); Hitoshi Kobayashi, Kanagawa-ken (JP); Yusuke Kawaguchi, Kanagawa-ken (JP); Shunsuke Katoh, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/024,141

(22) Filed: Sep. 11, 2013

(65) Prior Publication Data

US 2014/0284707 A1 Sep. 25, 2014

(30) Foreign Application Priority Data

Mar. 22, 2013 (JP) .................................. 2013-061132

(51) Int. Cl.
 *H01L 29/78* (2006.01)
 *H01L 29/66* (2006.01)
(52) U.S. Cl.
 CPC ...... *H01L 29/7813* (2013.01); *H01L 29/66734* (2013.01)
 USPC .......................................... 439/270; 257/330
(58) Field of Classification Search
 CPC ................................ H01L 29/78; H01L 29/66
 USPC ............................................ 257/330; 438/270
 See application file for complete search history.

(56) References Cited

U.S. PATENT DOCUMENTS

| | | | |
|---|---|---|---|
| 8,022,470 B2 | 9/2011 | Hirler | |
| 2003/0168713 A1* | 9/2003 | Narazaki et al. | 257/513 |
| 2004/0016963 A1* | 1/2004 | Baliga | 257/330 |
| 2011/0215399 A1 | 9/2011 | Matsuura et al. | |
| 2011/0318894 A1 | 12/2011 | Kobayashi et al. | |
| 2012/0056262 A1 | 3/2012 | Saito et al. | |
| 2012/0061753 A1 | 3/2012 | Nishiwaki | |

FOREIGN PATENT DOCUMENTS

JP  2011-199109 A  10/2011

* cited by examiner

*Primary Examiner* — Marc Armand
(74) *Attorney, Agent, or Firm* — White & Case LLP

(57) ABSTRACT

According to one embodiment, a semiconductor memory device includes a first semiconductor layer, a second semiconductor layer, a first electrode, and a second electrode. The first semiconductor layer is a first conductivity type. The second semiconductor layer is provided in a surface region of the first semiconductor layer and is the first conductivity type. The first electrode is provided inside a first trench extending in the first direction and opened to a surface of the second semiconductor layer. The second electrode is provided in a second trench extending in a second direction crossing the first direction and opened to the surface of the second semiconductor layer. A dimension from the surface of the second semiconductor layer to a lower end of the second electrode is shorter than a dimension from the surface of the second semiconductor layer to a lower end of the first electrode.

12 Claims, 20 Drawing Sheets

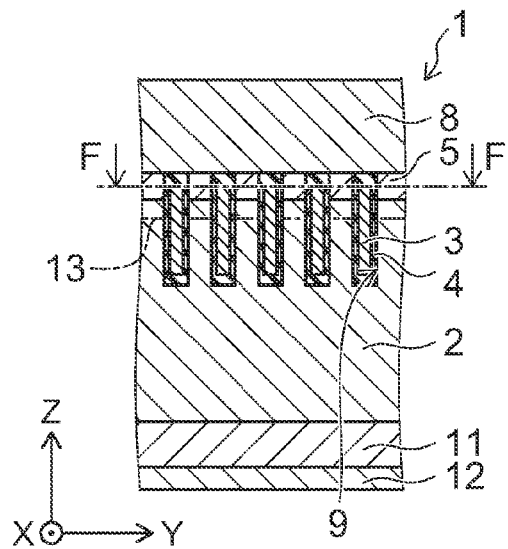
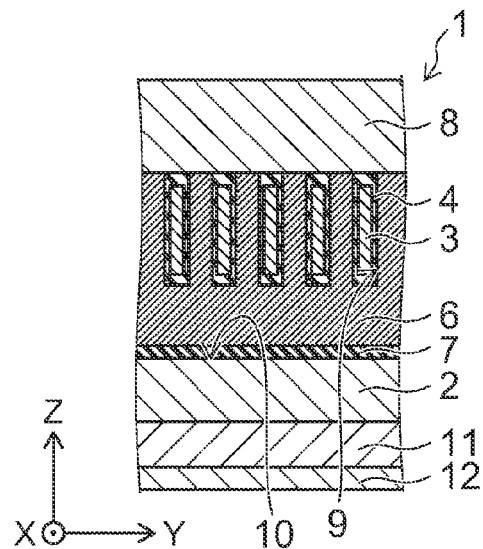
FIG. 3A　　　　　　　　FIG. 3B
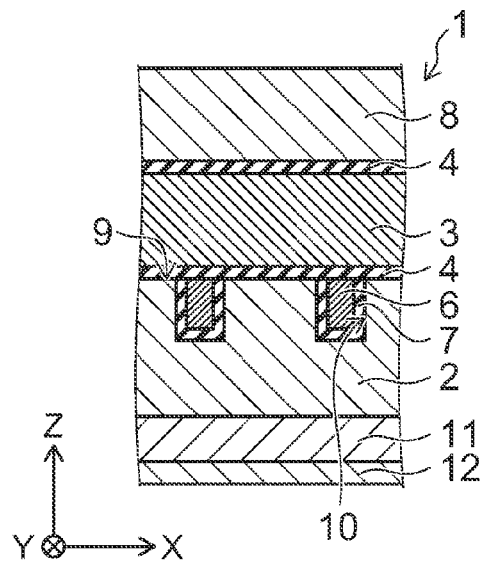
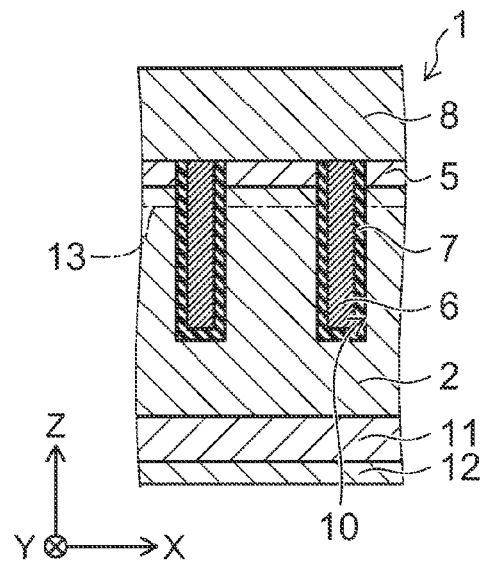
FIG. 3C　　　　　　　　FIG. 3D

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2013-061132, filed on Mar. 22, 2013; the entire contents of which are incorporated herein by reference.

FIELD

Embodiments described herein relate generally to a semiconductor device and a method for manufacturing the same.

BACKGROUND

There is known a vertical power MOSFET (metal oxide semiconductor field effect transistor) including a trench gate electrode provided inside a trench and a field plate electrode provided below the trench gate electrode.

Here, the trench gate electrode and the field plate electrode have different optimal pitch dimensions. Thus, there is proposed a power MOSFET in which trenches with a long depth dimension for providing a trench gate electrode and a field plate electrode, and trenches with a short depth dimension for providing a trench gate electrode, are alternately provided in parallel.

However, alignment for separately forming the trench with a long depth dimension and the trench with a short depth dimension is difficult. Thus, there is room for improvement from the viewpoint of productivity.

BRIEF DESCRIPTION OF THE DRAWINGS

FIGS. 3A to 3D are schematic views for illustrating the semiconductor device 1 according to the first embodiment;

DETAILED DESCRIPTION

Figure 1:
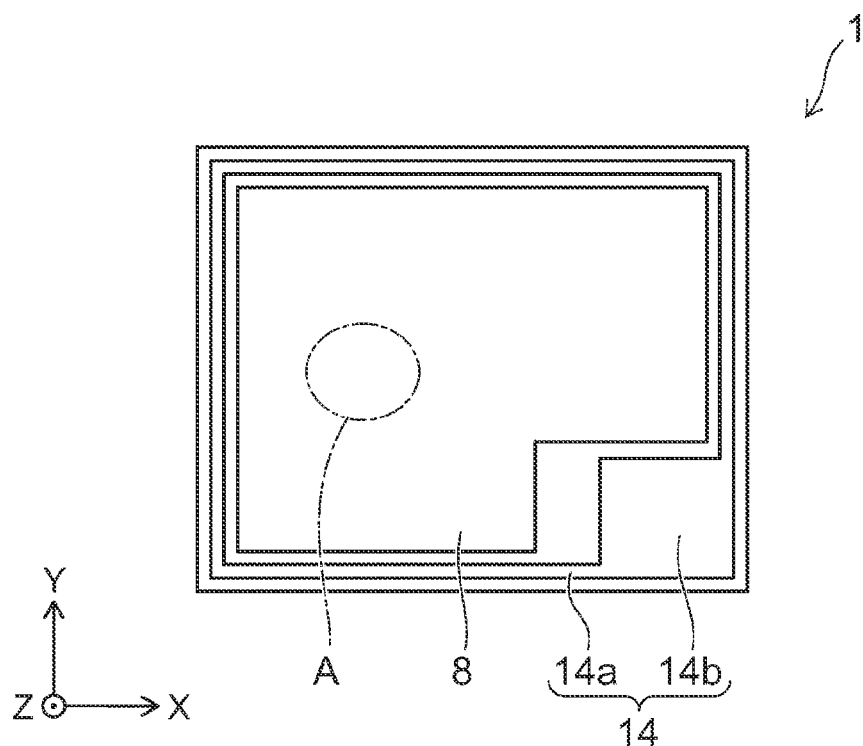
FIG. 1 is a schematic view for illustrating a semiconductor device 1 according to a first embodiment.

In general, according to one embodiment, a semiconductor memory device includes a first semiconductor layer, a second semiconductor layer, a first electrode, and a second electrode. The first semiconductor layer is a first conductivity type. The second semiconductor layer is provided in a surface region of the first semiconductor layer. The second semiconductor layer is the first conductivity type. The first electrode extends in a first direction. The first electrode is provided inside a first trench extending in the first direction and opened to a surface of the second semiconductor layer. The second electrode extends in a second direction crossing the first direction. The second electrode is provided in a second trench extending in the second direction and opened to the surface of the second semiconductor layer. A dimension from the surface of the second semiconductor layer to a lower end of the second electrode is shorter than a dimension from the surface of the second semiconductor layer to a lower end of the first electrode.

Various embodiments will be described hereinafter with reference to the accompanying drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

The arrows X, Y, and Z in the figures represent three directions orthogonal to each other. For instance, the arrows X and Y represent the directions parallel to the surface of the substrate 11. The arrow Z represents the direction perpendicular to the surface of the substrate 11 (stacking direction).

In the specification and the drawings, components similar to those described with reference to earlier figures are labeled with like reference numerals, and the detailed description thereof is omitted appropriately.

(First Embodiment)

FIG. 1 to FIG. 3D are schematic views for illustrating a semiconductor device 1 according to a first embodiment.

FIG. 1 is a top view of the semiconductor device 1 according to the first embodiment.

Figure 2:
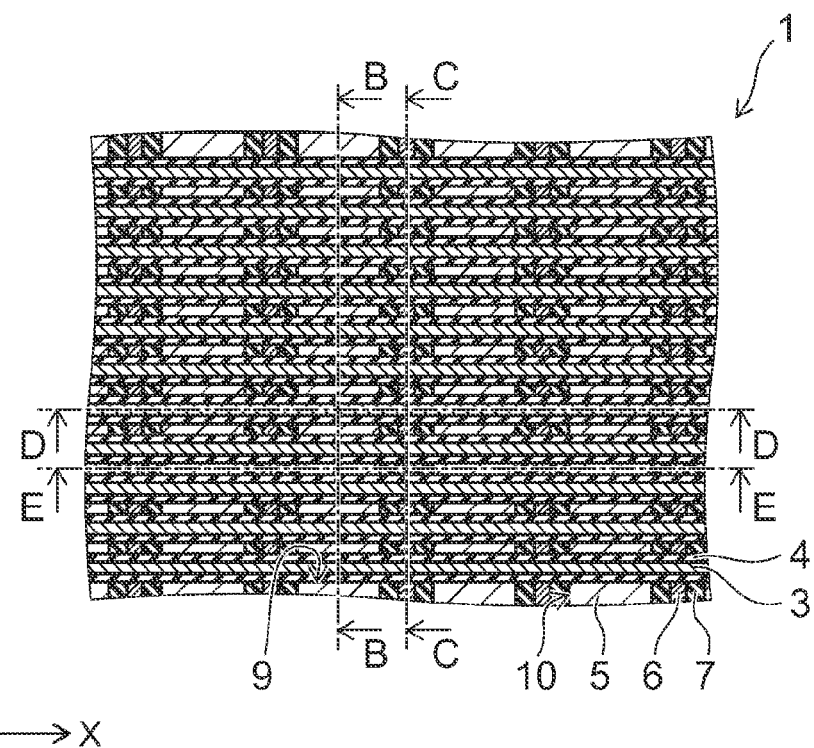
FIG. 2 is a schematic view for illustrating the semiconductor device 1 according to the first embodiment.

FIG. 2 is a schematic enlarged view of portion A in FIG. 1. However, in FIG. 2, the source electrode 8, and the gate insulating film 4 provided on the upper surface of the trench gate electrode 3, are not shown. That is, FIG. 2 is an F-F sectional view in FIG. 3A.

FIG. 3A is a B-B sectional view in FIG. 2.
FIG. 3B is a C-C sectional view in FIG. 2.
FIG. 3C is a D-D sectional view in FIG. 2.
FIG. 3D is an E-E sectional view in FIG. 2.

As shown in FIG. 1 to FIG. 3D, the semiconductor device 1 includes a substrate 11, a drift layer 2 (corresponding to an example of a first semiconductor layer), a trench gate electrode 3 (corresponding to an example of a second electrode), a gate insulating film 4, a source region 5 (corresponding to an example of a second semiconductor layer), a trench source electrode 6 (corresponding to an example of a first electrode), an insulating film 7, a source electrode 8 (corresponding to an example of a third electrode), a trench 9 (corresponding to an example of a second trench), a trench 10 (corresponding to an example of a first trench), a drain electrode 12, and a gate electrode 14.

The substrate 11 is formed from e.g. n$^+$-type (corresponding to an example of a first conductivity type) semiconductor. The n$^+$-type semiconductor is e.g. silicon (Si) doped with a donor such as phosphorus (P). In this case, the donor concentration is e.g. $1 \times 10^{19}$ cm$^{-3}$ or more.

The drift layer 2 is provided on one surface of the substrate 11. The drift layer 2 is formed from e.g. n$^-$-type (corresponding to an example of a first conductivity type) semiconductor. The n$^-$-type semiconductor is e.g. silicon doped with a donor such as phosphorus. In this case, the donor concentration is e.g. $1 \times 10^{17}$ cm$^{-3}$ or less.

The trench 9 pierces the source region 5 to the drift layer 2. The trench 9 is opened to the surface of the source region 5 and extends in the X direction (corresponding to an example of a second direction). The trench 9 is provided in a plurality with a prescribed spacing.

The trench gate electrode 3 is provided inside each of the plurality of trenches 9. The trench gate electrode 3 extends in the X direction inside the trench 9. The dimension from the surface of the source region 5 to the lower end of the trench gate electrode 3 is shorter than the dimension from the surface of the source region 5 to the lower end of the trench source electrode 6. Both end portions of the trench gate electrode 3 pierces the gate insulating film 4 and are electrically connected to a gate extraction interconnection 14a. The gate extraction interconnection 14a is electrically connected to a gate pad 14b. The trench gate electrode 3 is formed from e.g. polycrystalline silicon.

The gate insulating film 4 is provided inside each of the plurality of trenches 9. The gate insulating film 4 is provided inside the trench 9 so as to cover the trench gate electrode 3. The trench gate electrode 3 is insulated from the drift layer 2, the source region 5, the source electrode 8, and the trench source electrode 6 by the gate insulating film 4. The gate insulating film 4 is formed from e.g. silicon oxide.

The source region 5 is provided in the surface region of the drift layer 2. The source region 5 is formed from e.g. n$^+$-type semiconductor. The n$^+$-type semiconductor is e.g. silicon doped with a donor such as phosphorus. In this case, the donor concentration is e.g. $1 \times 10^{19}$ cm$^{-3}$ or more. That is, the donor concentration of the source region 5 is higher than the donor concentration of the drift layer 2.

The trench 10 pierces the source region 5 to the drift layer 2. The bottom surface position of the trench 10 is located below the bottom surface position of the trench 9. That is, the depth dimension of the trench 10 is longer than the depth dimension of the trench 9.

The trench 10 is opened to the surface of the source region 5 and extends in the Y direction (corresponding to an example of a first direction). The trench 10 is provided in a plurality with a prescribed spacing.

In this example, the extending direction of the plurality of trenches 9 is orthogonal to the extending direction of the plurality of trenches 10. However, these directions may cross at a prescribed angle. That is, the extending direction of the plurality of trenches 9 and the extending direction of the plurality of trenches 10 only need to cross each other.

The trench source electrode 6 is provided inside each of the plurality of trenches 10. The trench source electrode 6 extends in the Y direction inside the trench 10. The upper surface of the trench source electrode 6 is exposed to the surface of the source region 5 and electrically connected to the source electrode 8. The lower surface position of the trench source electrode 6 is located below the lower surface position of the trench gate electrode 3. The trench source electrode 6 is formed from e.g. polycrystalline silicon.

In this example, the extending direction of the plurality of trench gate electrodes 3 is orthogonal to the extending direction of the plurality of trench source electrodes 6. However, these directions may be crossed at a prescribed angle. That is, the extending direction of the plurality of trench gate electrodes 3 and the extending direction of the plurality of trench source electrodes 6 only need to cross each other.

The insulating film 7 is provided inside each of the plurality of trenches 10. The insulating film 7 is provided inside the trench 10 so as to cover the side surface and lower surface of the trench source electrode 6. The trench source electrode 6 is insulated from the drift layer 2 and the source region 5 by the insulating film 7. The insulating film 7 is formed from e.g. silicon oxide.

The source electrode 8 is provided so as to cover the upper surface of the source region 5, the upper surface of the gate insulating film 4, the upper end surface of the insulating film 7, and the upper surface of the trench source electrode 6. That is, the source electrode 8 is electrically connected to the source region 5 and the trench source electrode 6. The source electrode 8 is formed from e.g. a metal such as copper (Cu) and aluminum (Al), or an alloy.

The drain electrode 12 is provided on the surface of the substrate 11 on the opposite side from the side provided with the drift layer 2. The drain electrode 12 is formed from e.g. a metal such as copper and aluminum, or an alloy.

The gate electrode 14 is provided on the drift layer 2 via an insulating film, not shown. The gate electrode 14 includes a gate extraction interconnection 14a provided around the source electrode 8, and a gate pad 14b electrically connected to the gate extraction interconnection 14a. The gate electrode 14 is formed from e.g. a metal such as copper and aluminum, or an alloy.

Furthermore, a base region 13 (corresponding to an example of a third semiconductor layer) can be provided between the source region 5 and the drift layer 2. The base region 13 is formed from e.g. p-type (corresponding to an example of a second conductivity type) semiconductor. The p-type semiconductor is e.g. silicon doped with an acceptor such as boron (B). The base region 13 is not necessarily needed, but can be provided as necessary.

Furthermore, a protective film, not shown, can also be provided so as to cover the source electrode 8. The protective film can be formed from e.g. polyimide (PI), permanent resist, P—SiN, or P—SiO. The protective film is provided to protect the source electrode 8. The protective film can be provided as necessary.

In the semiconductor device 1 according to the embodiment, the extending direction of the plurality of trenches 9 and the extending direction of the plurality of trenches 10 cross each other. Thus, when the plurality of trenches 9 with a short depth dimension and the plurality of trenches 10 with a long depth dimension are separately formed, there is no need to consider the alignment accuracy between the plurality of trenches 9 and the plurality of trenches 10. As a result, the productivity can be improved.

Furthermore, irrespective of the pitch dimension of the plurality of trenches 9, the pitch dimension of the plurality of trenches 10 can be configured. That is, irrespective of the pitch dimension of the plurality of trench gate electrodes 3, the pitch dimension of the plurality of trench source electrodes 6 can be configured. Thus, for the plurality of trench gate electrodes 3 and the plurality of trench source electrodes 6, respective optimal pitch dimensions can be configured.

(Second Embodiment)

Figure 4:
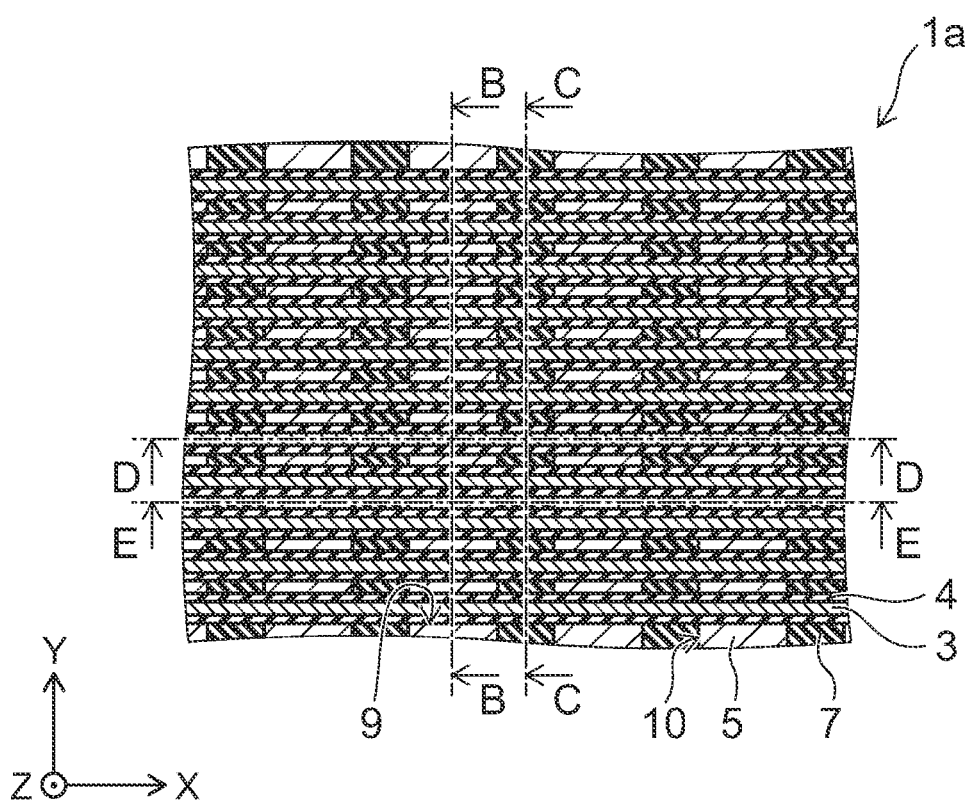
FIG. 4 is a schematic view for illustrating a semiconductor device 1a according to a second embodiment.
Figure 5A:
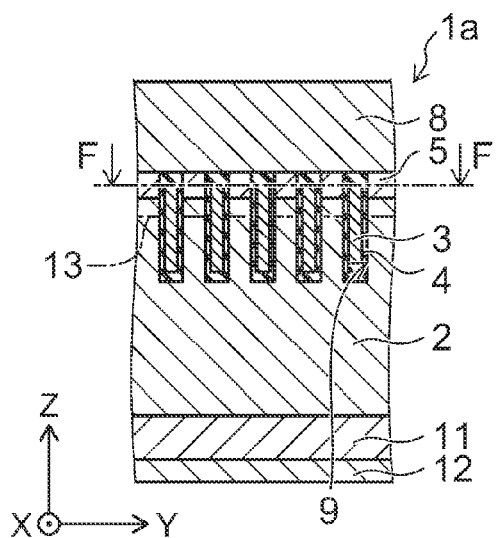
FIGS. 5A to 5D are schematic views for illustrating the semiconductor device 1a according to the second embodiment.
Figure 5B:
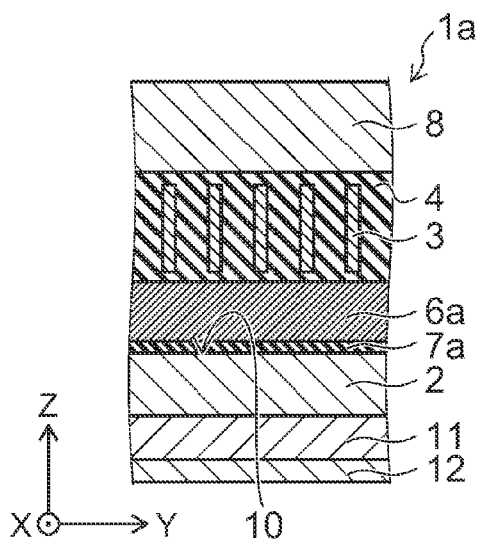
Figure 5C:
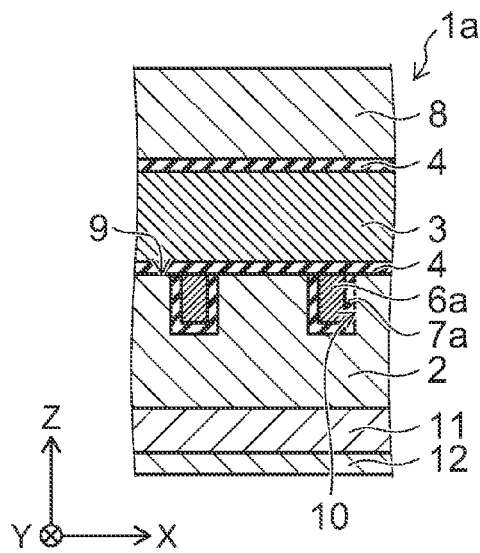
Figure 5D:
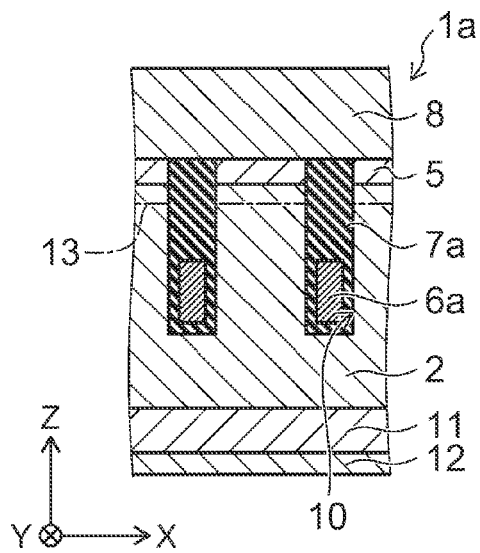
Figure 6A:
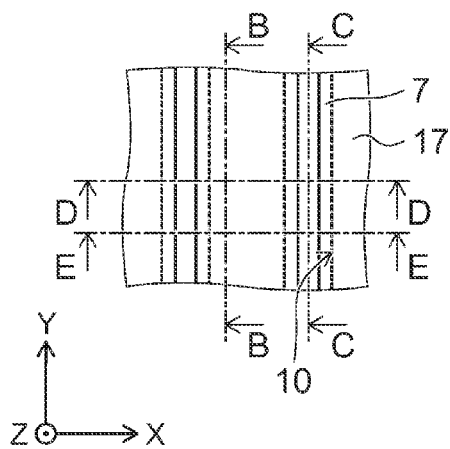
FIGS. 6A to 6E are schematic process sectional views for illustrating a method for manufacturing a semiconductor device according to a third embodiment.
Figure 6B:
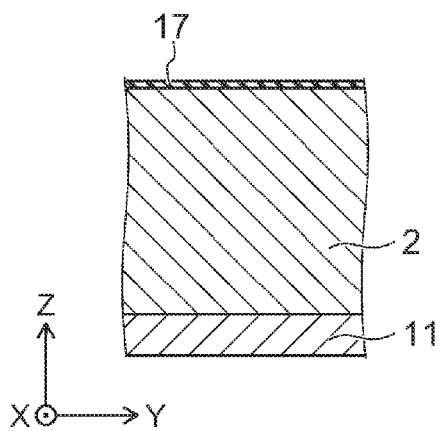
Figure 6C:
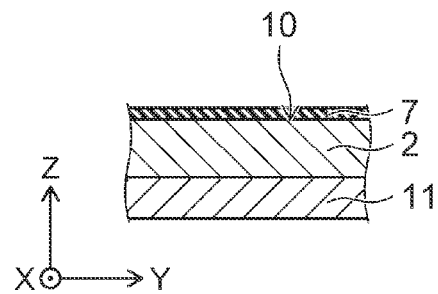
Figure 6D:
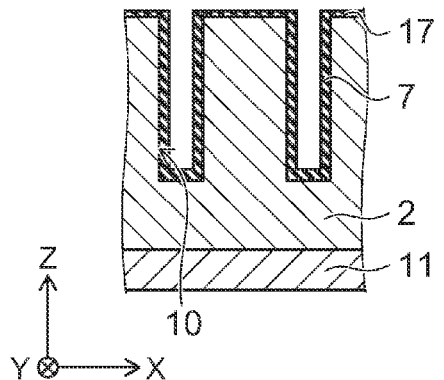
Figure 6E:
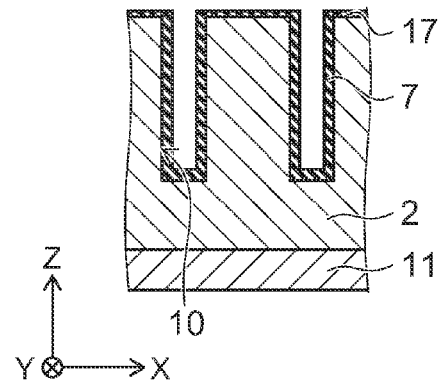
Figure 7A:
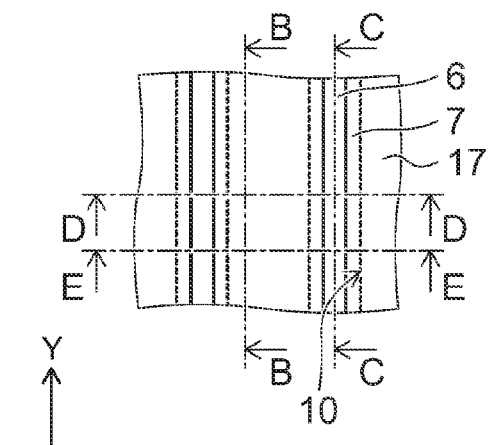
FIGS. 7A to 7E are schematic process sectional views for illustrating the method for manufacturing the semiconductor device according to the third embodiment.
Figure 7B:
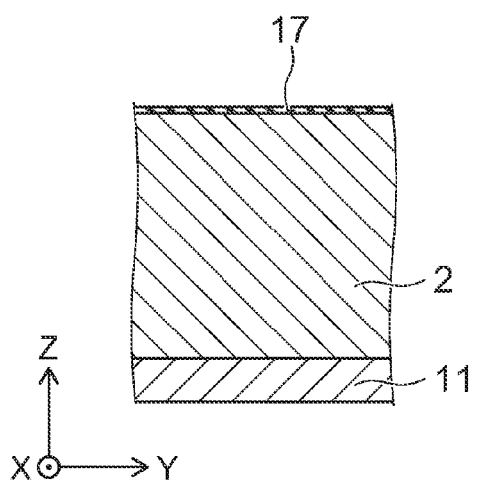
Figure 7C:
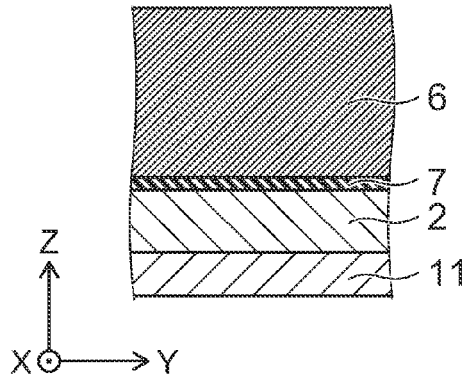
Figure 7D:
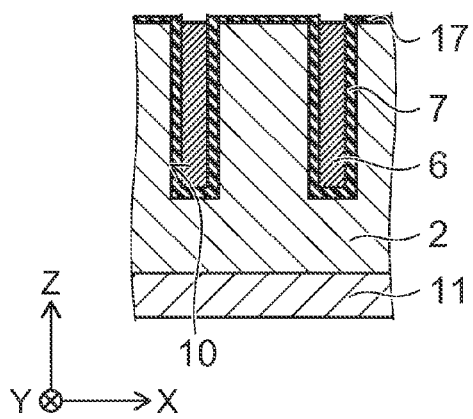
Figure 7E:
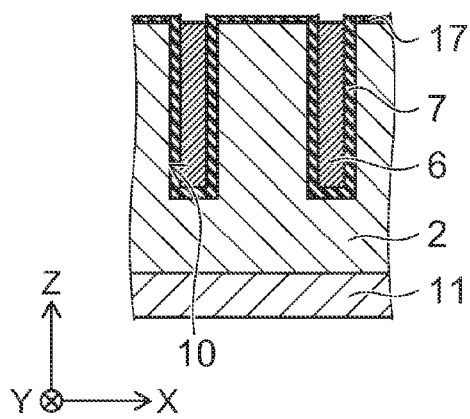
Figure 8A:
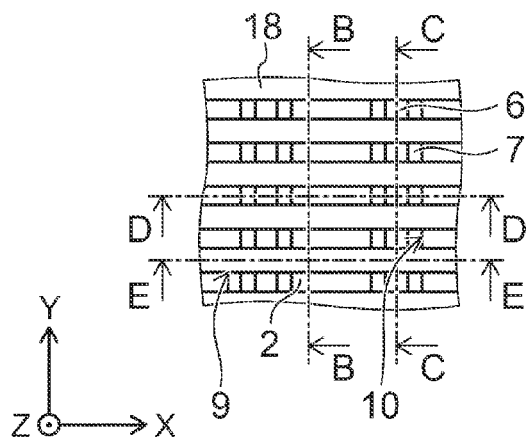
FIGS. 8A to 8E are schematic process sectional views for illustrating the method for manufacturing the semiconductor device according to the third embodiment.
Figure 8B:
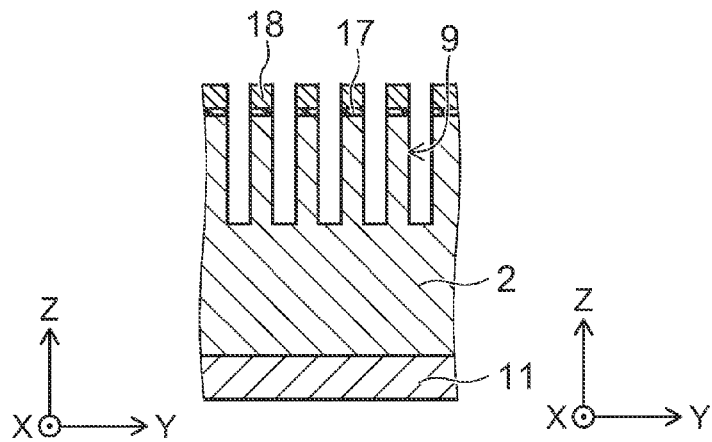
Figure 8C:
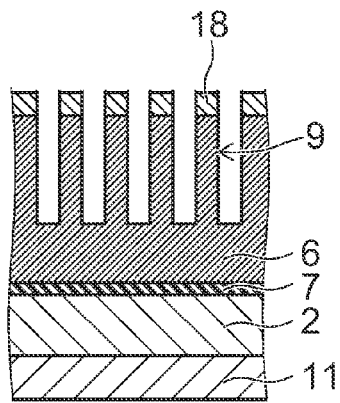
Figure 8D:
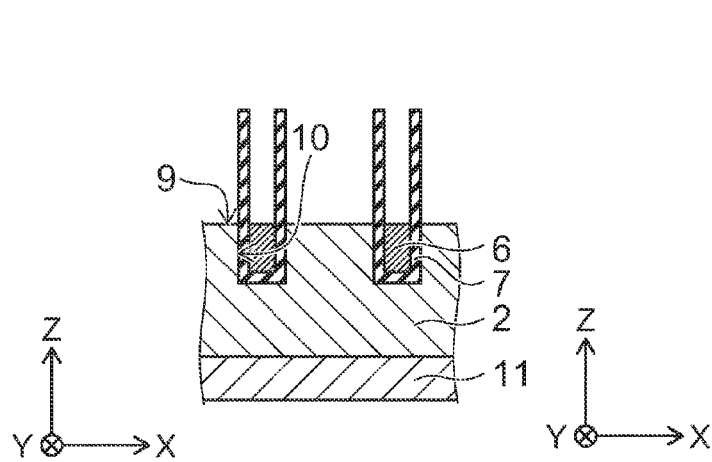
Figure 8E:
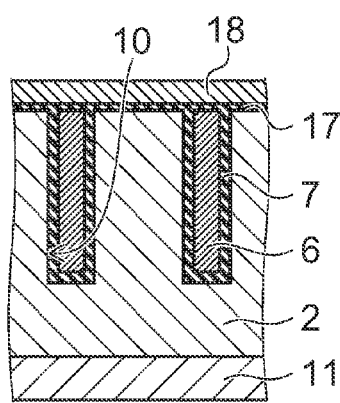

FIG. 4 to FIG. 5D are schematic views for illustrating a semiconductor device 1a according to a second embodiment.

The top view of the semiconductor device 1a according to the second embodiment can be made similar to FIG. 1 described above.

FIG. 4 is a schematic enlarged view of the portion corresponding to portion A in FIG. 1. However, in FIG. 4, the source electrode 8, and the gate insulating film 4 provided on the upper surface of the trench gate electrode 3, are not shown. That is, FIG. 4 is an F-F sectional view in FIG. 5A.

FIG. 5A is a B-B sectional view in FIG. 4.
FIG. 5B is a C-C sectional view in FIG. 4.
FIG. 5C is a D-D sectional view in FIG. 4.
FIG. 5D is an E-E sectional view in FIG. 4.

As shown in FIG. 4 to FIG. 5D, the semiconductor device 1a includes a substrate 11, a drift layer 2, a trench gate electrode 3, a gate insulating film 4, a source region 5, a trench source electrode 6a (corresponding to an example of a first electrode), an insulating film 7a, a source electrode 8, a trench 9, a trench 10, and a drain electrode 12.

Furthermore, like the aforementioned semiconductor device 1, a base region 13, and a protective film, not shown, covering the source electrode 8, can also be provided.

The trench source electrode 6a is provided inside each of the plurality of trenches 10. The trench source electrode 6a extends in the Y direction inside the trench 10. The end portion in the Y direction of the trench source electrode 6a pierces the insulating film 7a and is electrically connected to the source electrode 8. The dimension from the surface of the source region 5 to the upper end of the trench source electrode 6a is longer than the dimension from the surface of the source region 5 to the lower end of the trench gate electrode 3. That is, the upper surface position of the trench source electrode 6a is located below the lower surface position of the trench gate electrode 3. In other words, the trench source electrode 6a is provided below the trench gate electrode 3. The trench gate electrode 3 and the trench source electrode 6a are spaced from each other in the Z direction. The trench source electrode 6a is formed from e.g. polycrystalline silicon.

In this example, the extending direction of the plurality of trench gate electrodes 3 is orthogonal to the extending direction of the plurality of trench source electrodes 6a. However, these directions may be crossed at a prescribed angle. That is, the extending direction of the plurality of trench gate electrodes 3 and the extending direction of the plurality of trench source electrodes 6a only need to cross each other.

The insulating film 7a is provided inside each of the plurality of trenches 10. The insulating film 7a is provided inside the trench 10 so as to cover the trench source electrode 6a. The trench source electrode 6a is insulated from the drift layer 2 by the insulating film 7a. The insulating film 7a is formed from e.g. silicon oxide.

The source electrode 8 is provided so as to cover the upper surface of the source region 5, the upper surface of the gate insulating film 4, and the upper end surface of the insulating film 7a. That is, the source electrode 8 is electrically connected to the source region 5. Furthermore, as described above, the source electrode 8 is electrically connected to the trench source electrode 6a.

In the semiconductor device 1a according to the embodiment, the extending direction of the plurality of trenches 9 and the extending direction of the plurality of trenches 10 cross each other. Thus, when the plurality of trenches 9 with a short depth dimension and the plurality of trenches 10 with a long depth dimension are separately formed, there is no need to consider the alignment accuracy between the plurality of trenches 9 and the plurality of trenches 10. As a result, the productivity can be improved.

Furthermore, irrespective of the pitch dimension of the plurality of trenches 9, the pitch dimension of the plurality of trenches 10 can be configured. That is, irrespective of the pitch dimension of the plurality of trench gate electrodes 3, the pitch dimension of the plurality of trench source electrodes 6a can be configured. Thus, for the plurality of trench gate electrodes 3 and the plurality of trench source electrodes 6a, respective optimal pitch dimensions can be configured.

Furthermore, the trench gate electrode 3 and the trench source electrode 6a are spaced from each other in the Z direction. Thus, the gate-source capacitance can be reduced.

(Third Embodiment)

FIG. 6A to FIG. 13E are schematic process sectional views for illustrating a method for manufacturing a semiconductor device according to a third embodiment.

The figures with the suffix A are top views of the process in which the semiconductor device is manufactured.

The figures with the suffix B are B-B sectional views in the corresponding figures with the suffix A.

The figures with the suffix C are C-C sectional views in the corresponding figures with the suffix A.

The figures with the suffix D are D-D sectional views in the corresponding figures with the suffix A.

The figures with the suffix E are E-E sectional views in the corresponding figures with the suffix A.

Here, FIG. 6A to FIG. 13E illustrate the method for manufacturing the aforementioned semiconductor device 1.

First, as shown in FIGS. 6A to 6E, on a substrate 11 formed from n$^+$-type semiconductor, an n$^-$-type semiconductor is epitaxially grown to form a drift layer 2.

Subsequently, an oxide film 17 is formed on the upper surface of the drift layer 2. The oxide film 17 can be formed by using e.g. thermal oxidation technique.

Subsequently, a plurality of trenches 10 extending in the Y direction are formed in the drift layer 2. The trenches 10 can be formed as follows, for instance. By using photolithography technique, a resist mask having a desired opening is formed. Then, by using e.g. RIE (reactive ion etching) technique, the drift layer 2 exposed in the opening of the resist mask is etched. Thus, the trenches 10 can be formed. The depth dimension of the trench 10 is made longer than the depth dimension of the trench 9 described later.

Subsequently, an insulating film 7 is formed on the inner wall of the trench 10. The insulating film 7 can be formed by using e.g. thermal oxidation technique.

Next, as shown in FIGS. 7A to 7E, a film of polycrystalline silicon is formed on the insulating film 7 inside the trench 10. Thus, polycrystalline silicon is embedded inside the trench 10. The film formation of polycrystalline silicon can be performed by using e.g. CVD (chemical vapor deposition) technique. Subsequently, the upper surface of the polycrystalline silicon embedded inside the trench 10 is etched back to form a trench source electrode 6. That is, a trench source electrode 6 extending in the Y direction is formed inside the trench 10.

Next, as shown in FIGS. 8A to 8E, a plurality of trenches 9 extending in the X direction are formed. The trenches 9 can be formed as follows, for instance. By using CVD technique, a mask 18 having a desired opening and made of silicon oxide is formed. Then, by using e.g. RIE technique, the drift layer 2 and the trench source electrode 6 exposed in the opening of the mask 18 are etched. Thus, the trenches 9 can be formed. The depth dimension of the trench 9 is made shorter than the depth dimension of the trench 10 described above.

In this example, the extending direction of the plurality of trenches 9 is orthogonal to the extending direction of the plurality of trenches 10. However, these directions may cross at a prescribed angle. That is, the extending direction of the plurality of trenches 9 and the extending direction of the plurality of trenches 10 only need to cross each other.

Next, as shown in FIGS. 9A to 9E, the mask 18 is removed. The removal of the mask 18 can be performed by using e.g. RIE technique.

Figure 9A:
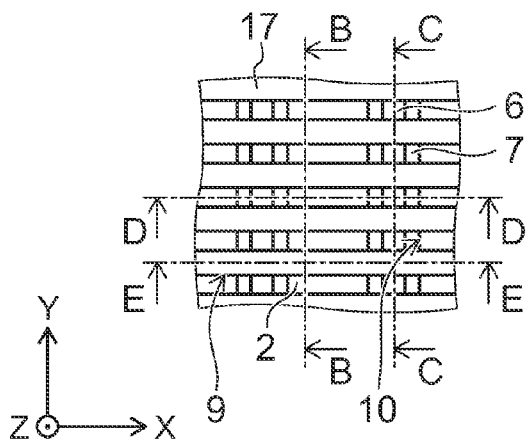
FIGS. 9A to 9E are schematic process sectional views for illustrating the method for manufacturing the semiconductor device according to the third embodiment.
Figure 9B:
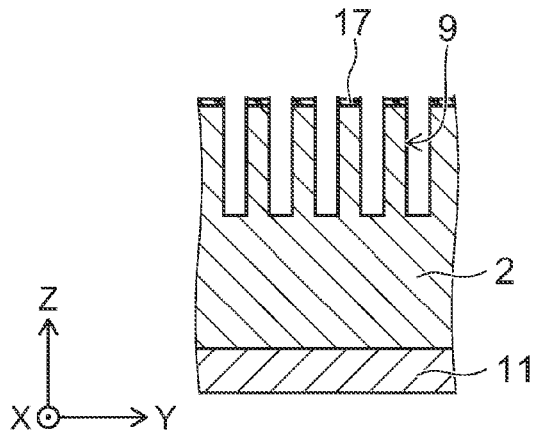
Figure 9C:
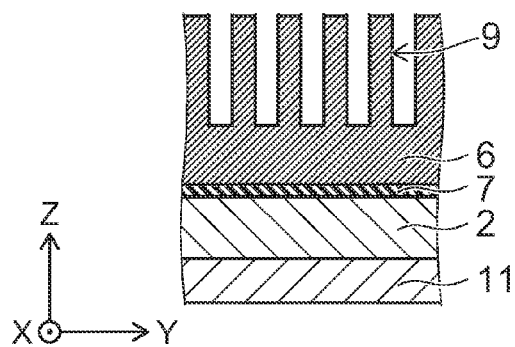
Figure 9D:
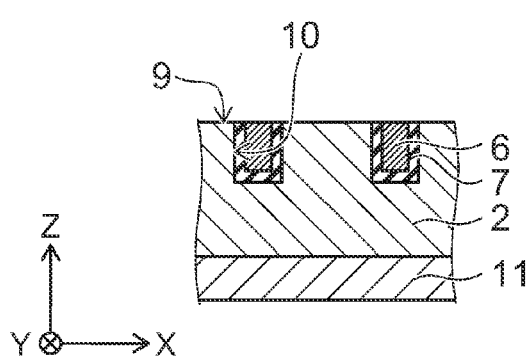
Figure 9E:
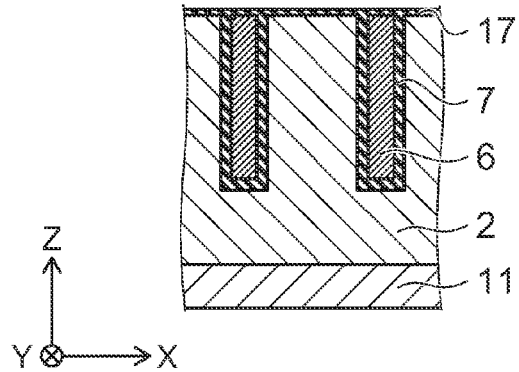
Figure 10A:
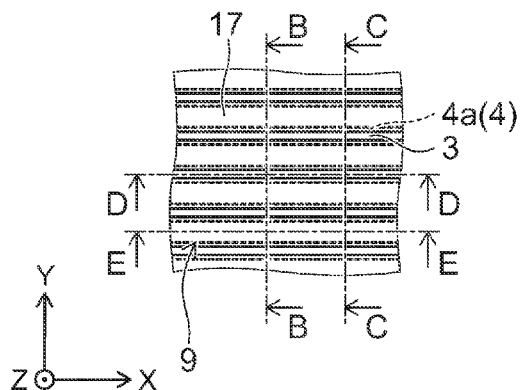
FIGS. 10A to 10E are schematic process sectional views for illustrating the method for manufacturing the semiconductor device according to the third embodiment.
Figure 10B:
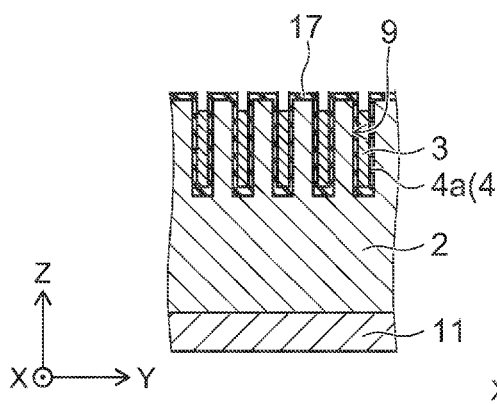
Figure 10C:
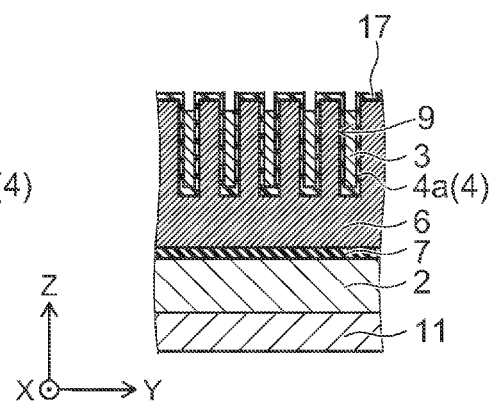
Figure 10D:
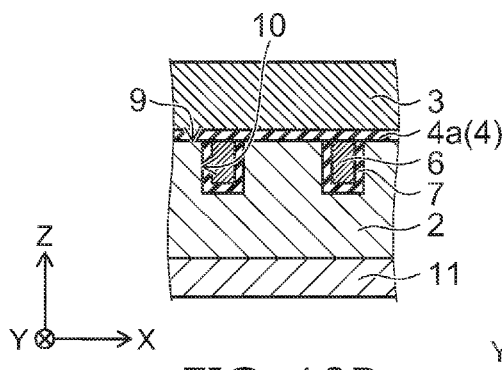
Figure 10E:
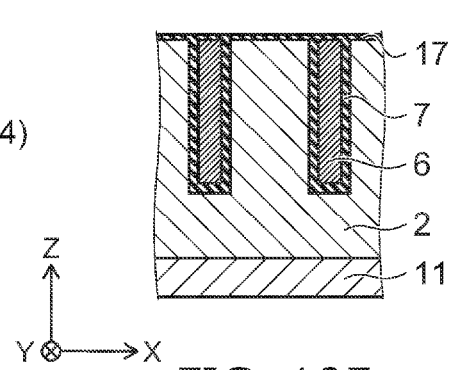
Figure 11A:
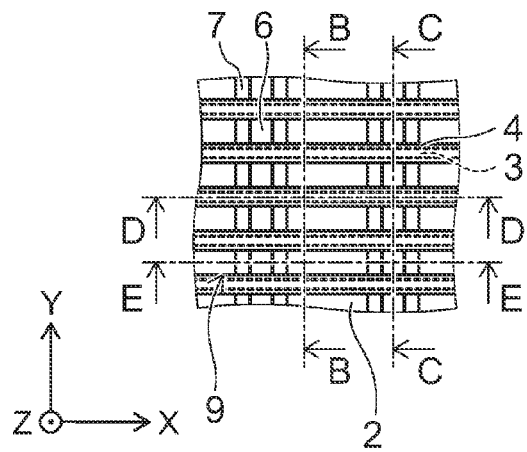
FIGS. 11A to 11E are schematic process sectional views for illustrating the method for manufacturing the semiconductor device according to the third embodiment.
Figure 11B:
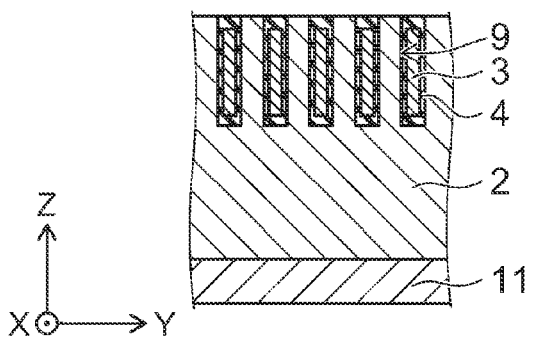
Figure 11C:
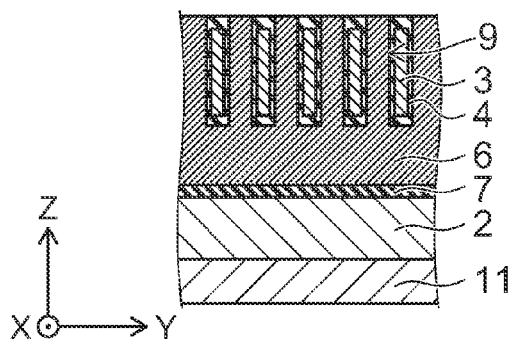
Figure 11D:
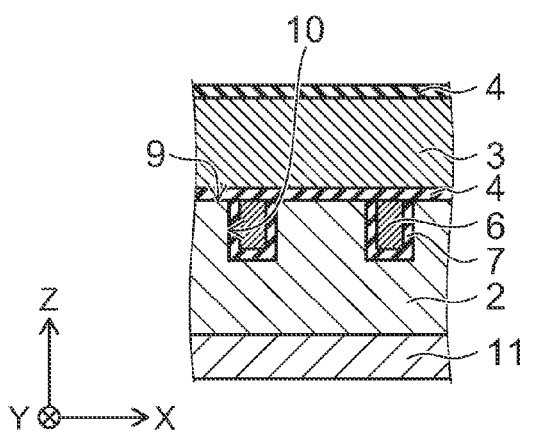
Figure 11E:
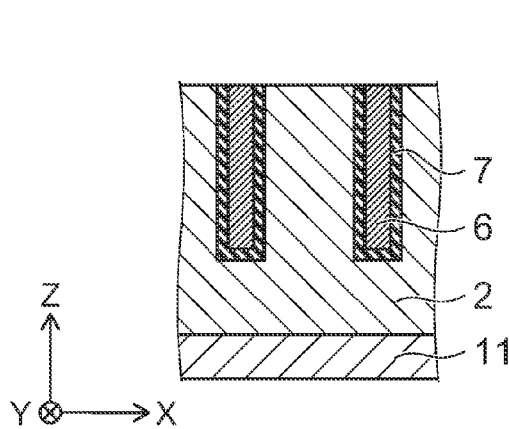
Figure 12A:
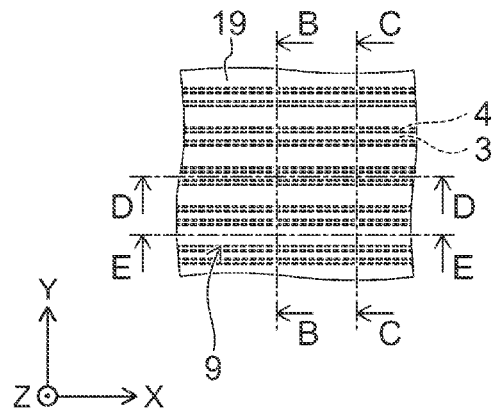
FIGS. 12A to 12E are schematic process sectional views for illustrating the method for manufacturing the semiconductor device according to the third embodiment.
Figure 12B:
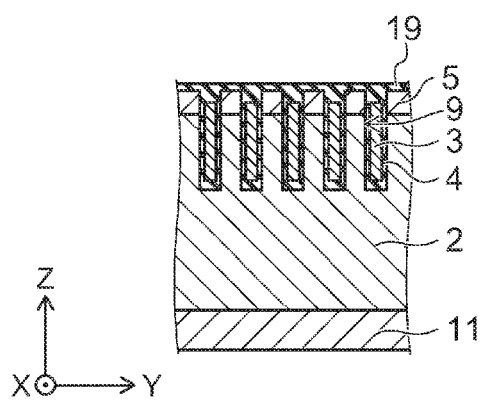
Figure 12C:
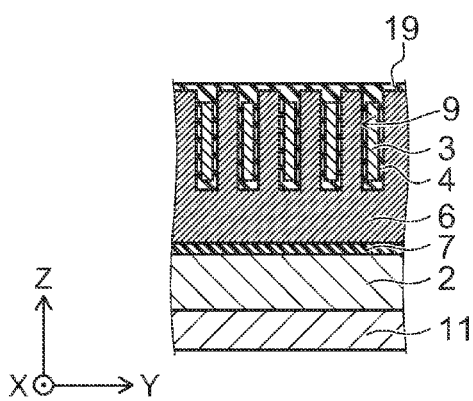
Figure 12D:
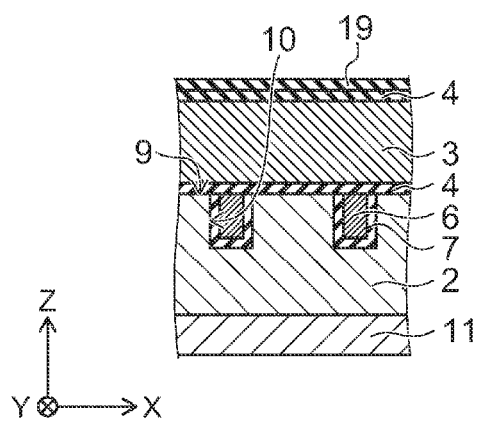
Figure 12E:
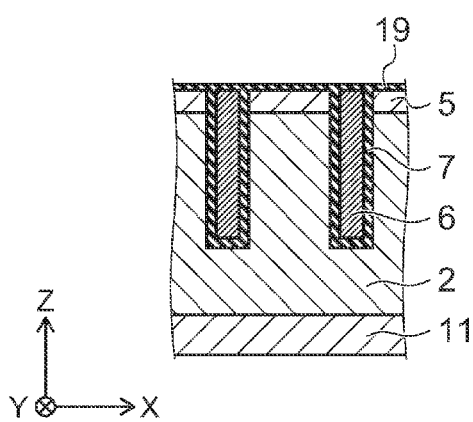
Figure 13A:
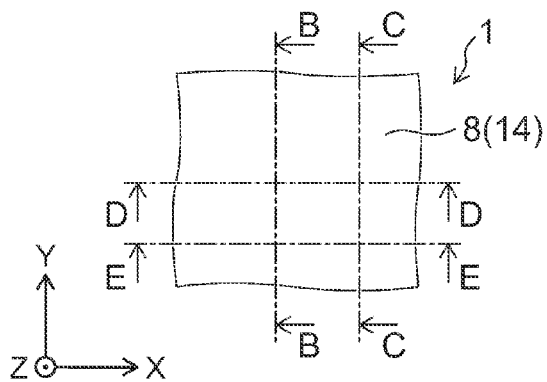
FIGS. 13A to 13E are schematic process sectional views for illustrating the method for manufacturing the semiconductor device according to the third embodiment.
Figure 13B:
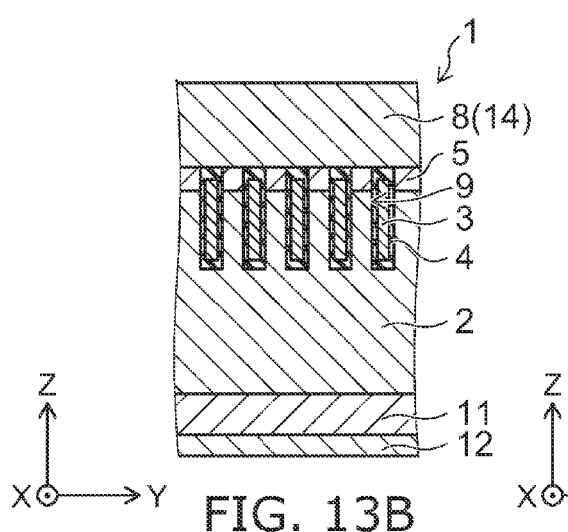
Figure 13C:
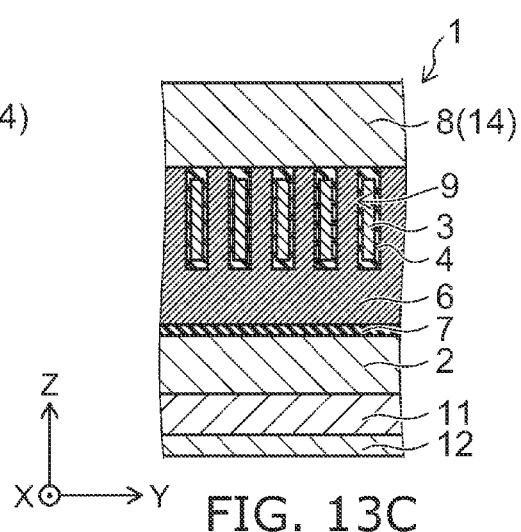
Figure 13D:
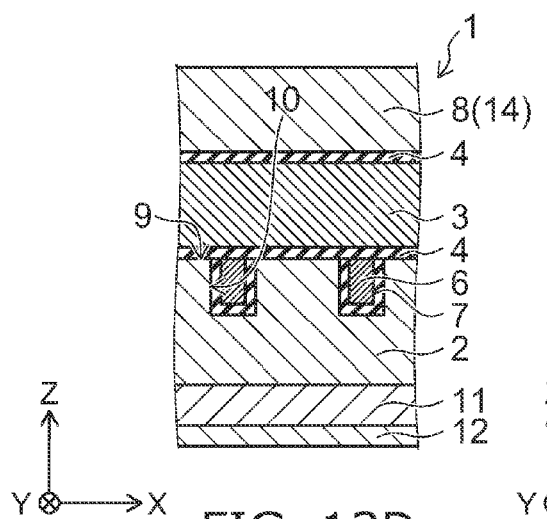
Figure 13E:
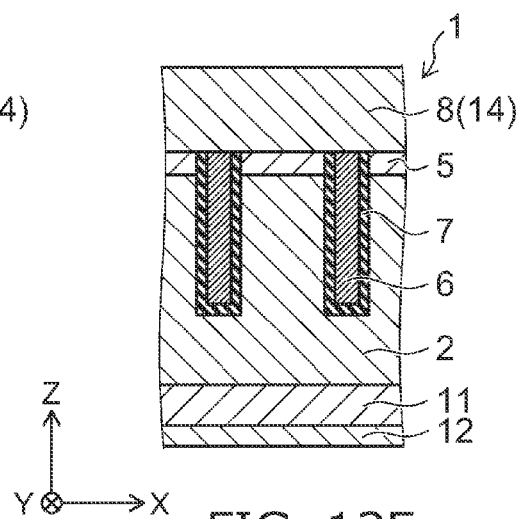
Figure 14A:
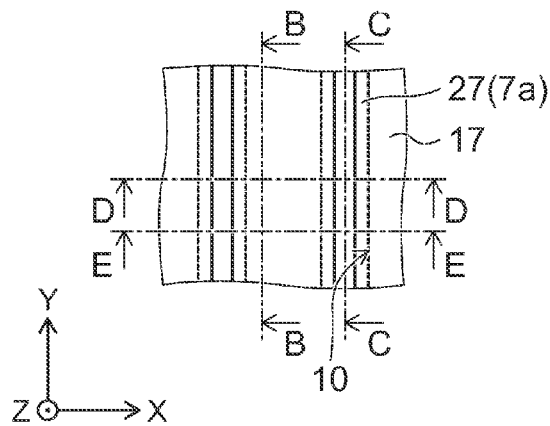
FIGS. 14A to 14E are schematic process sectional views for illustrating a method for manufacturing a semiconductor device according to a fourth embodiment.
Figure 14B:
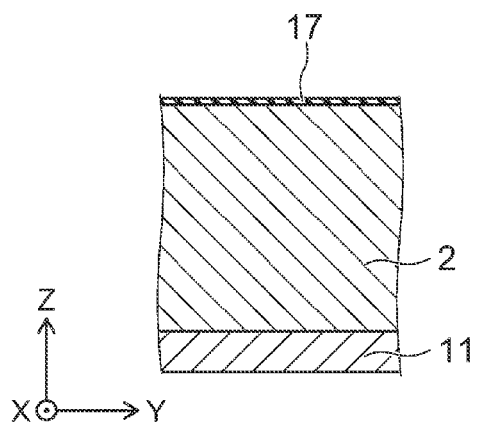
Figure 14C:
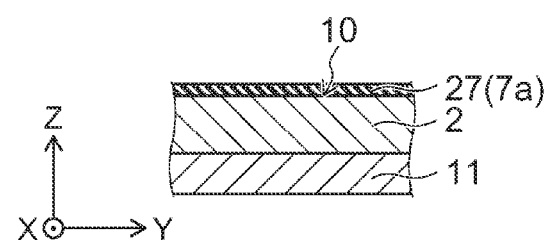
Figure 14D:
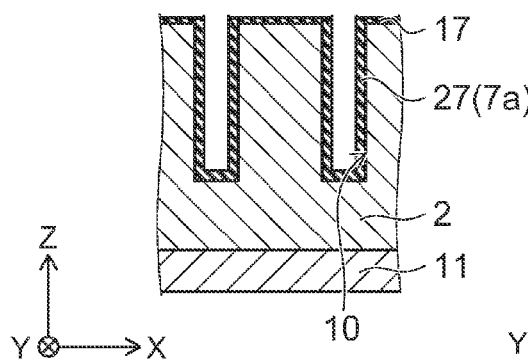
Figure 14E:
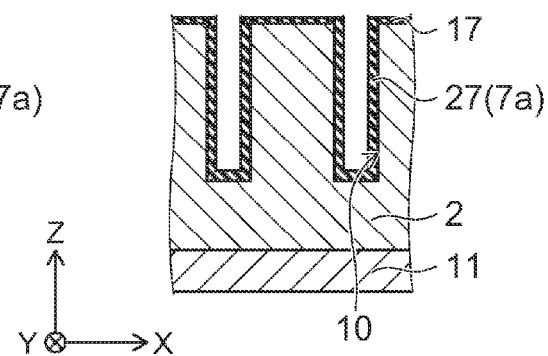
Figure 15A:
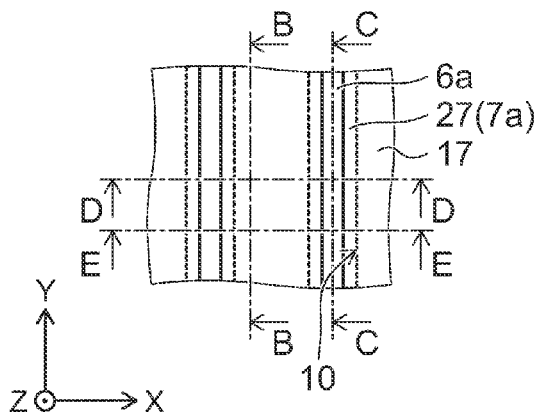
FIGS. 15A to 15E are schematic process sectional views for illustrating the method for manufacturing the semiconductor device according to the fourth embodiment.
Figure 15B:
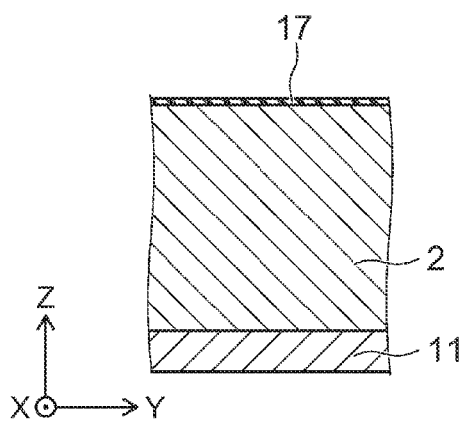
Figure 15C:
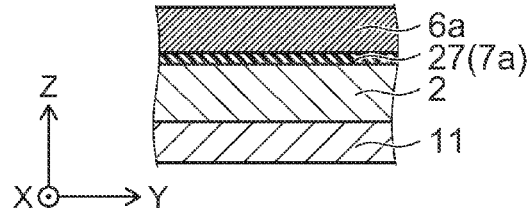
Figure 15D:
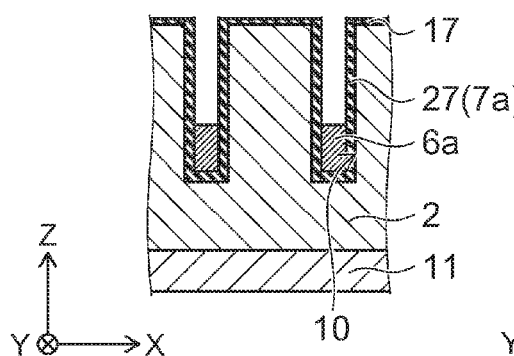
Figure 15E:
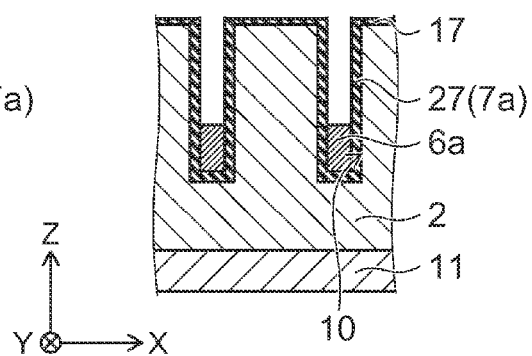
Figure 16A:
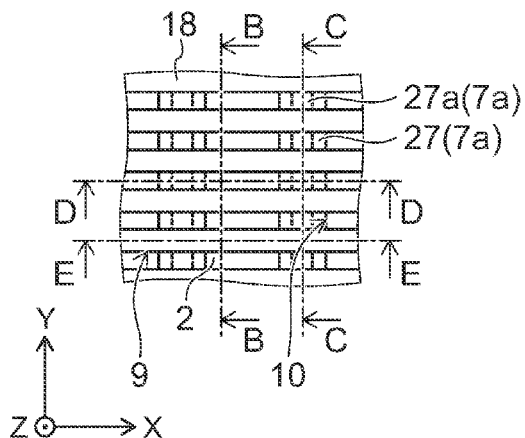
FIGS. 16A to 16E are schematic process sectional views for illustrating the method for manufacturing the semiconductor device according to the fourth embodiment.
Figure 16B:
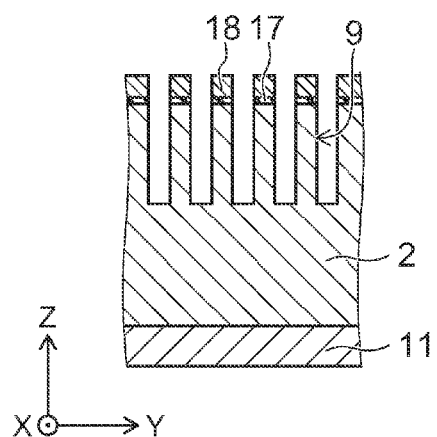
Figure 16C:
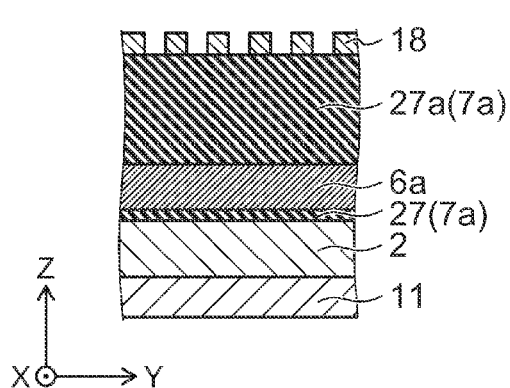
Figure 16D:
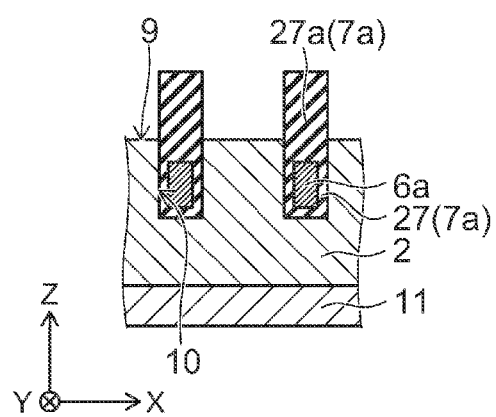
Figure 16E:
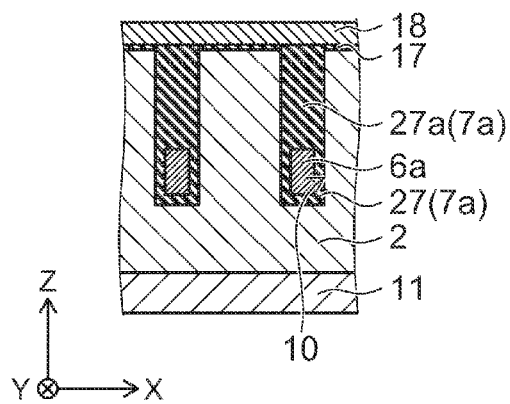

At this time, as shown in FIG. 9D, the portion of the insulating film 7 projected from the drift layer 2 is also removed.

Next, as shown in FIGS. 10A to 10E, an insulating film 4a is formed on the inner wall of the trench 9 to form part of a gate insulating film 4. The insulating film 4a can be formed by using e.g. thermal oxidation technique.

Subsequently, a film of polycrystalline silicon is formed on the insulating film 4a inside the trench 9. Thus, polycrystalline silicon is embedded inside the trench 9. The film formation of polycrystalline silicon can be performed by using e.g. CVD technique.

Subsequently, the upper surface of the polycrystalline silicon embedded inside the trench 9 is etched back to form a trench gate electrode 3. That is, a trench gate electrode 3 extending in the X direction is formed inside the trench 9.

In the step of forming a trench gate electrode 3 extending in the X direction inside the trench 9, a trench gate electrode 3 is formed so that the dimension from the surface of the source region 5 to the lower end of the trench gate electrode 3 is shorter than the dimension from the surface of the source region 5 to the lower end of the trench source electrode 6.

Next, as shown in FIGS. 11A to 11E, silicon oxide or the like is embedded above the trench gate electrode 3 inside the trench 9 to form a gate insulating film 4.

For instance, by using CVD technique, a film made of e.g. silicon oxide is formed so as to cover the upper surface of the drift layer 2. Then, etch-back is performed until the upper surface of the drift layer 2 is exposed. Thus, a gate insulating film 4 embedded inside the trench 9 can be formed.

Next, as shown in FIGS. 12A to 12E, a source region 5 made of $n^+$-type semiconductor is formed in the surface region of the drift layer 2.

For instance, an insulating film 19 is formed on the drift layer 2, the gate insulating film 4, and the trench source electrode 6. The insulating film 19 can be formed from e.g. silicon oxide. The insulating film 19 is formed to a thickness such that impurity ions can penetrate therethrough at the time of ion implantation.

Subsequently, by using e.g. photolithography technique, a resist mask having an opening at a position corresponding to the source region 5 is formed. Then, impurity ions are implanted through the opening of the resist mask.

Subsequently, by annealing treatment, the implanted impurity is activated to form a source region 5.

Next, as shown in FIGS. 13A to 13E, the insulating film 19 is removed. Then, a source electrode 8, a drain electrode 12, and a gate electrode 14 are formed.

The removal of the insulating film 19 can be performed by using e.g. RIE technique.

The source electrode 8 and the gate electrode 14 are formed on the side of the drift layer 2 where the source region 5 is formed.

The drain electrode 12 is formed on the side of the drift layer 2 opposite from the side where the source region 5 is formed.

The formation of the source electrode 8, the drain electrode 12, and the gate electrode 14 can be performed by using e.g. sputtering technique.

As described above, the semiconductor device 1 can be manufactured.

In the method for manufacturing a semiconductor device according to the embodiment, the extending direction of the plurality of trenches 9 and the extending direction of the plurality of trenches 10 are crossed with each other. Thus, when the plurality of trenches 9 with a short depth dimension and the plurality of trenches 10 with a long depth dimension are separately formed, there is no need to consider the alignment accuracy between the plurality of trenches 9 and the plurality of trenches 10. As a result, the productivity can be improved.

Furthermore, irrespective of the pitch dimension of the plurality of trenches 9, the pitch dimension of the plurality of trenches 10 can be configured. That is, irrespective of the pitch dimension of the plurality of trench gate electrodes 3, the pitch dimension of the plurality of trench source electrodes 6 can be configured. Thus, for the plurality of trench gate electrodes 3 and the plurality of trench source electrodes 6, respective optimal pitch dimensions can be configured.

(Fourth Embodiment)

FIG. 14A to FIG. 21E are schematic process sectional views for illustrating a method for manufacturing a semiconductor device according to a fourth embodiment.

The figures with the suffix A are top views of the process in which the semiconductor device is manufactured.

The figures with the suffix B are B-B sectional views in the corresponding figures with the suffix A.

The figures with the suffix C are C-C sectional views in the corresponding figures with the suffix A.

The figures with the suffix D are D-D sectional views in the corresponding figures with the suffix A.

The figures with the suffix E are E-E sectional views in the corresponding figures with the suffix A.

Here, FIG. 14A to FIG. 21E illustrate the method for manufacturing the aforementioned semiconductor device 1a. However, due to the difference of the processing method and the like, the cross-sectional shape of the trench gate electrode 3, for instance, is different from that illustrated in FIG. 5.

First, as shown in FIGS. 14A to 14E, on a substrate 11 formed from $n^+$-type semiconductor, an $n^-$-type semiconductor is epitaxially grown to form a drift layer 2.

Subsequently, an oxide film 17 is formed on the upper surface of the drift layer 2. The oxide film 17 can be formed by using e.g. thermal oxidation technique.

Subsequently, a plurality of trenches 10 extending in the Y direction are formed. The trenches 10 can be formed as follows, for instance. By using photolithography technique, a resist mask having a desired opening is formed. Then, by using e.g. RIE (reactive ion etching) technique, the drift layer 2 exposed in the opening of the resist mask is etched. Thus, the trenches 10 can be formed. The depth dimension of the trench 10 is made longer than the depth dimension of the trench 9 described later.

Subsequently, an insulating film 27 constituting part of the insulating film 7a is formed on the inner wall of the trench 10. The insulating film 27 can be formed by using e.g. thermal oxidation technique.

Next, as shown in FIGS. 15A to 15E, a film of polycrystalline silicon is formed on the insulating film 27 inside the trench 10. Thus, polycrystalline silicon is embedded inside the trench 10. The film formation of polycrystalline silicon can be performed by using e.g. CVD (chemical vapor deposition) technique.

Subsequently, the upper surface of the polycrystalline silicon embedded inside the trench 10 is etched back to form a trench source electrode 6a.

Thus, in the step of forming a trench source electrode 6a extending in the Y direction inside the trench 10, a trench source electrode 6a is formed so that the dimension from the surface of the source region 5 described later to the upper end of the trench source electrode 6a is longer than the dimension from the surface of the source region 5 to the lower end of the trench gate electrode 3 described later.

Next, as shown in FIGS. 16A to 16E, a plurality of trenches 9 extending in the X direction are formed. The trenches 9 can be formed as follows, for instance. By using CVD technique, a mask 18 having a desired opening and made of silicon oxide is formed. Then, by using e.g. RIE technique, the drift layer 2 exposed in the opening of the mask 18 is etched. Thus, the trenches 9 can be formed. The depth dimension of the trench 9 is made shorter than the depth dimension of the trench 10 described above.

When the mask 18 is formed by using CVD technique, an insulating film 27a constituting part of the insulating film 7a is embedded also inside the trench 10.

In this example, the extending direction of the plurality of trenches 9 is orthogonal to the extending direction of the plurality of trenches 10. However, these directions may cross at a prescribed angle. That is, the extending direction of the plurality of trenches 9 and the extending direction of the plurality of trenches 10 only need to cross each other.

Next, as shown in FIGS. 17A to 17E, the mask 18 is removed. The removal of the mask 18 can be performed by using e.g. we etching technique.

Figure 17A:
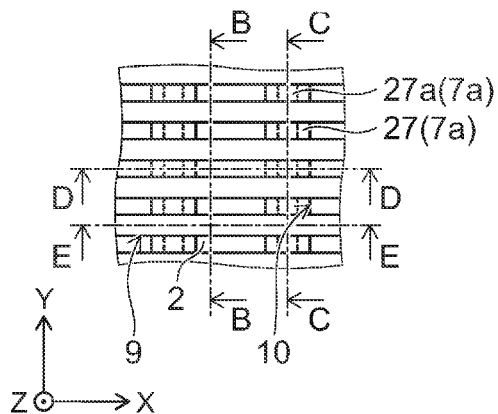
FIGS. 17A to 17E are schematic process sectional views for illustrating the method for manufacturing the semiconductor device according to the fourth embodiment.
Figure 17B:
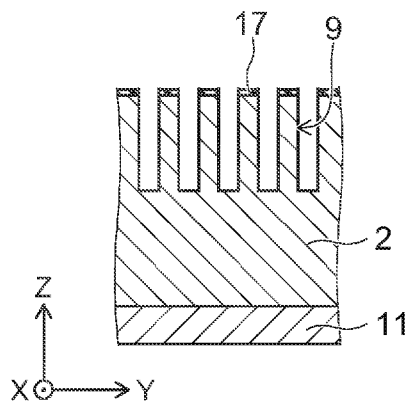
Figure 17C:
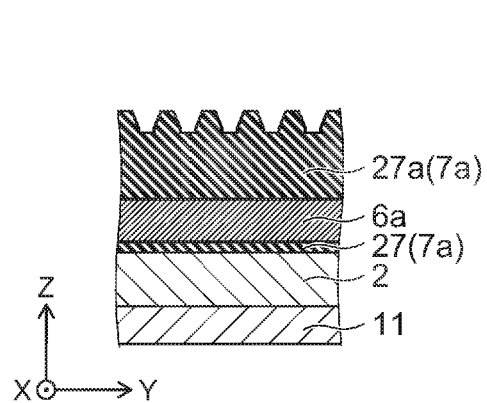
Figure 17D:
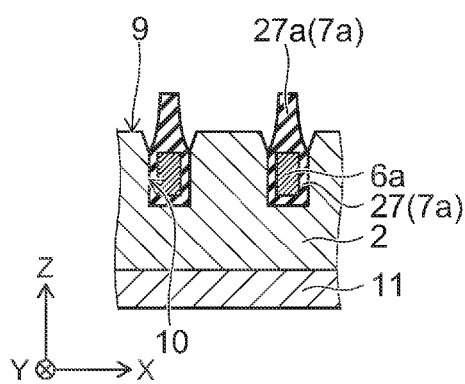
Figure 17E:
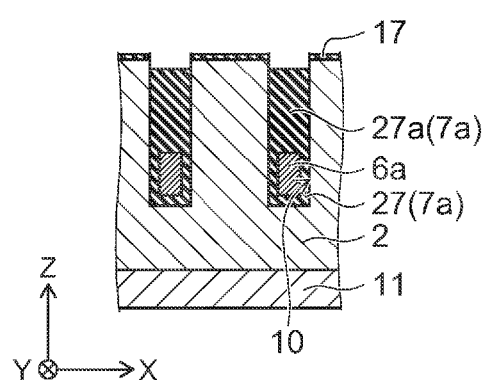
Figure 18A:
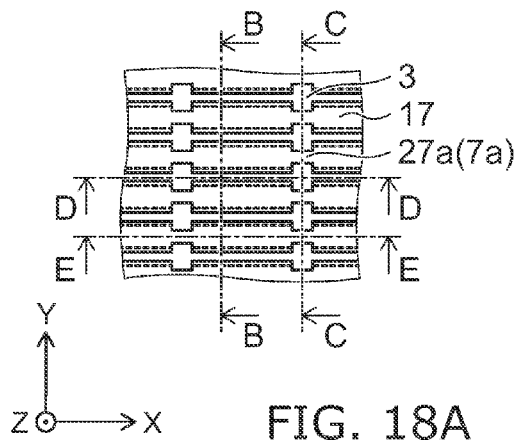
FIGS. 18A to 18E are schematic process sectional views for illustrating the method for manufacturing the semiconductor device according to the fourth embodiment.
Figure 18B:
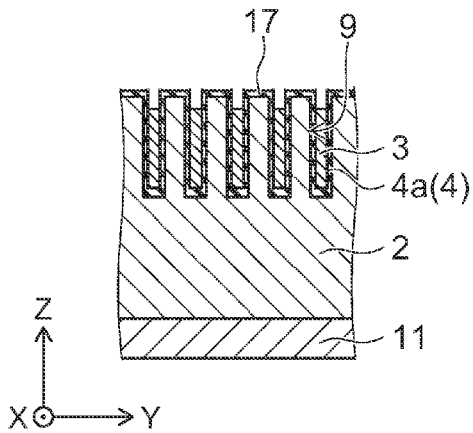
Figure 18C:
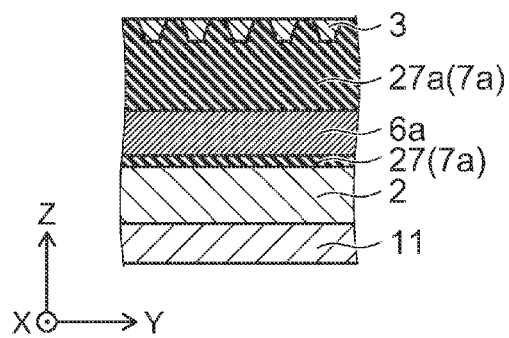
Figure 18D:
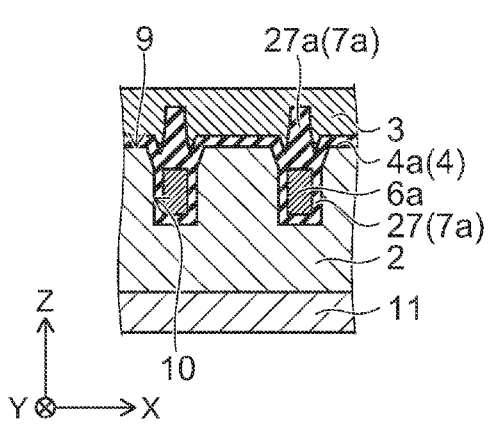
Figure 18E:
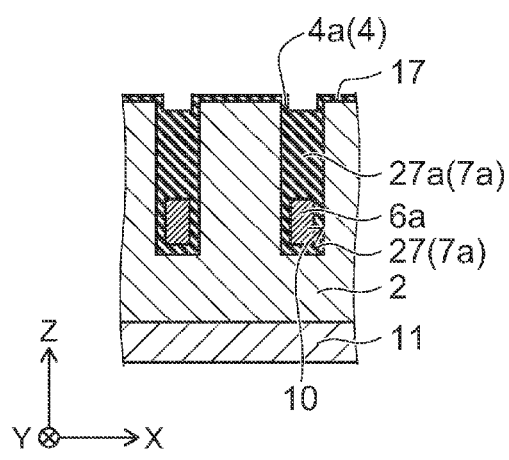
Figure 19A:
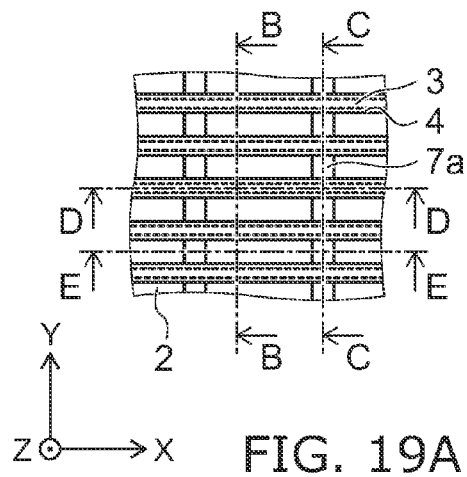
FIGS. 19A to 19E are schematic process sectional views for illustrating the method for manufacturing the semiconductor device according to the fourth embodiment.
Figure 19B:
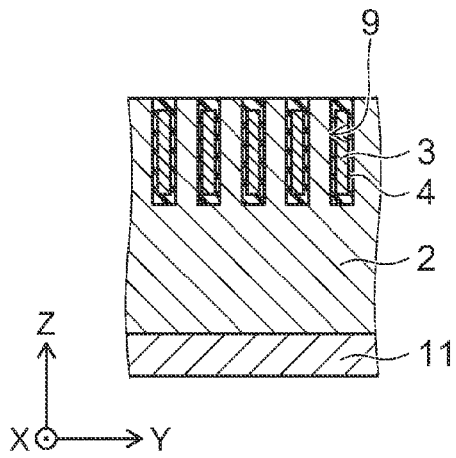
Figure 19C:
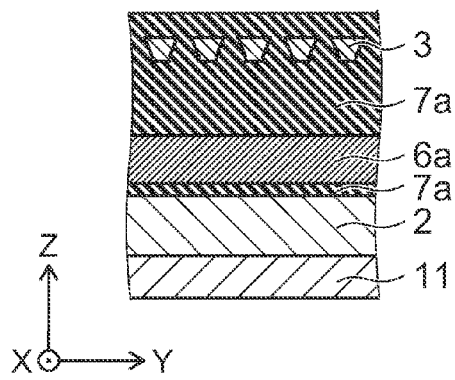
Figure 19D:
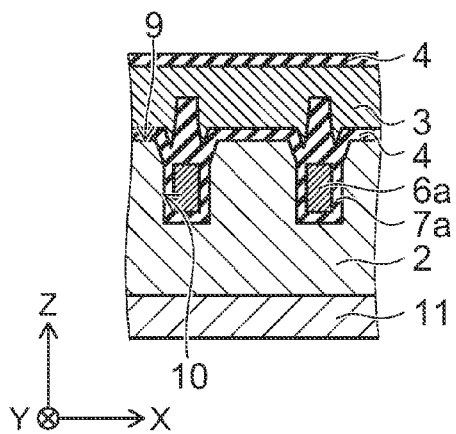
Figure 19E:
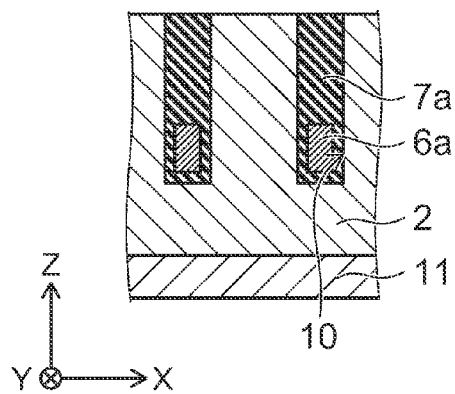
Figure 20A:
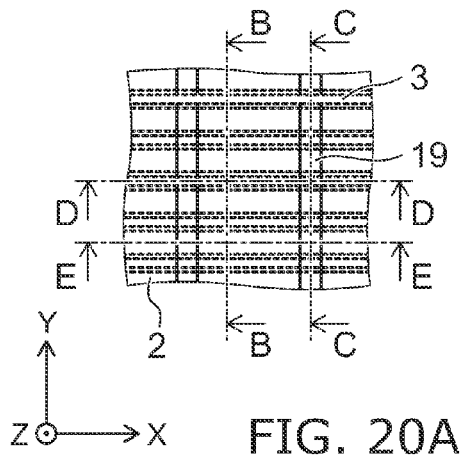
FIGS. 20A to 20E are schematic process sectional views for illustrating the method for manufacturing the semiconductor device according to the fourth embodiment.
Figure 20B:
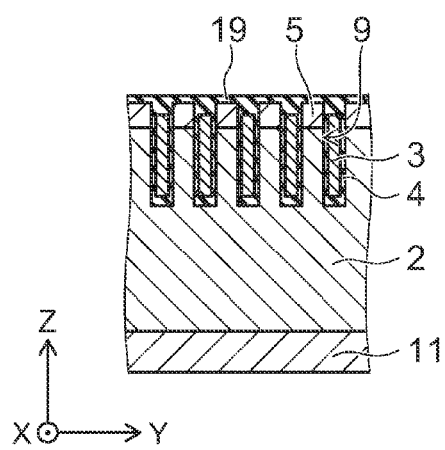
Figure 20C:
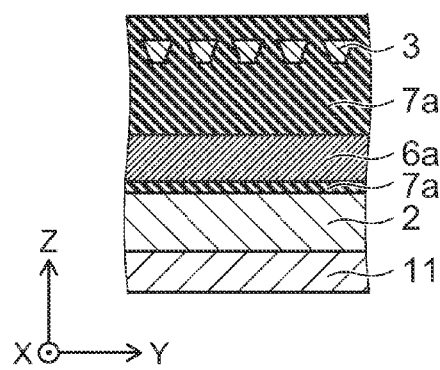
Figure 20D:
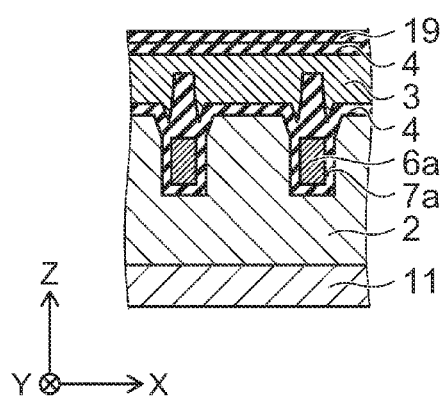
Figure 20E:
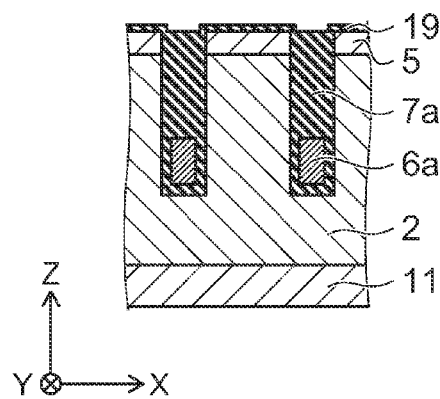
Figure 21A:
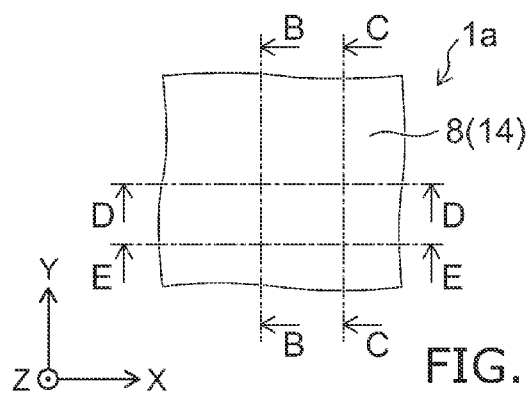
FIGS. 21A to 21E are schematic process sectional views for illustrating the method for manufacturing the semiconductor device according to the fourth embodiment.
Figure 21B:
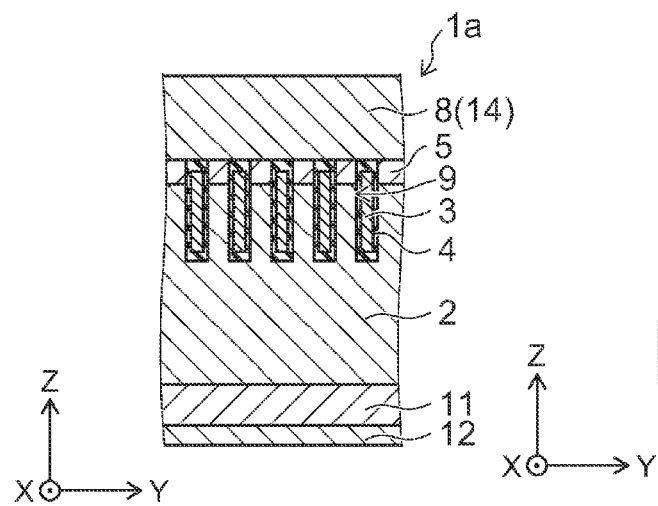
Figure 21C:
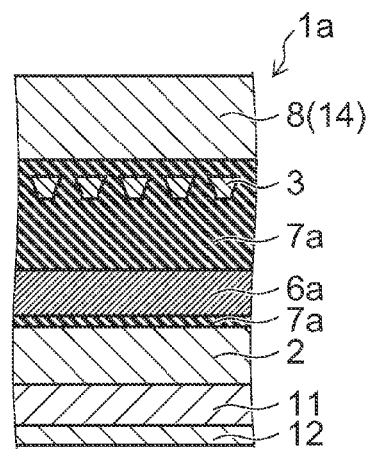
Figure 21D:
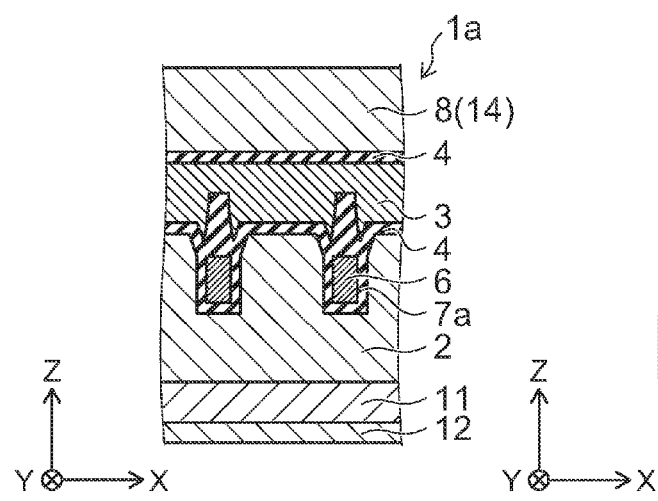
Figure 21E:
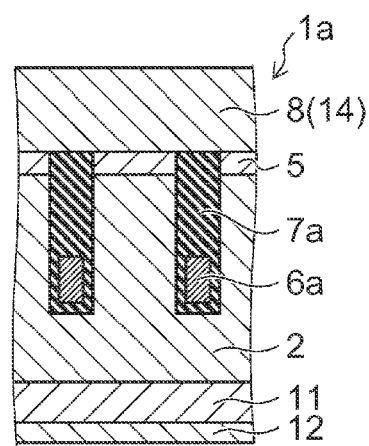

At this time, as shown in FIGS. 17C, 17D, and 17E, part of the exposed portion of the insulating film 27a is also removed.

Next, as shown in FIGS. 18A to 18E, an insulating film 4a is formed on the inner wall of the trench 9 to form part of a gate insulating film 4. The insulating film 4a can be formed by using e.g. thermal oxidation technique.

Subsequently, a film of polycrystalline silicon is formed on the insulating film 4a inside the trench 9. Thus, polycrystalline silicon is embedded inside the trench 9. The film formation of polycrystalline silicon can be performed by using e.g. CVD technique.

Subsequently, the upper surface of the polycrystalline silicon embedded inside the trench 9 is etched back to form a trench gate electrode 3.

Next, as shown in FIGS. 19A to 19E, silicon oxide or the like is embedded above the trench gate electrode 3 inside the trench 9 to form a gate insulating film 4.

For instance, by using CVD technique, a film made of e.g. silicon oxide is formed so as to cover the upper surface of the drift layer 2. Then, etch-back is performed until the upper surface of the drift layer 2 is exposed. Thus, a gate insulating film 4 embedded inside the trench 9 can be formed.

At this time, silicon oxide or the like is embedded also above the insulating film 27a inside the trench 10. Thus, an insulating film 7a is embedded inside the trench 10.

Next, as shown in FIGS. 20A to 20E, a source region 5 made of $n^+$-type semiconductor is formed in the surface region of the drift layer 2.

For instance, an insulating film 19 is formed on the drift layer 2 and the gate insulating film 4. The insulating film 19 can be formed from e.g. silicon oxide. The insulating film 19 is formed to a thickness such that impurity ions can penetrate therethrough at the time of ion implantation.

Subsequently, by using e.g. photolithography technique, a resist mask having an opening at a position corresponding to the source region 5 is formed. Then, impurity ions are implanted through the opening of the resist mask.

Subsequently, by annealing treatment, the implanted impurity is activated to form a source region 5.

Next, as shown in FIGS. 21A to 21E, the insulating film 19 is removed. Then, a source electrode 8, a drain electrode 12, and a gate electrode 14 are formed.

The removal of the insulating film 19 can be performed by using e.g. RIE technique.

The source electrode 8 and the gate electrode 14 are formed on the side of the drift layer 2 where the source region 5 is formed.

The drain electrode 12 is formed on the side of the drift layer 2 opposite from the side where the source region 5 is formed.

The formation of the source electrode 8, the drain electrode 12, and the gate electrode 14 can be performed by using e.g. sputtering technique.

As described above, the semiconductor device 1a can be manufactured.

In the method for manufacturing a semiconductor device according to the embodiment, the extending direction of the plurality of trenches 9 and the extending direction of the plurality of trenches 10 are crossed with each other. Thus, when the plurality of trenches 9 with a short depth dimension and the plurality of trenches 10 with a long depth dimension are separately formed, there is no need to consider the alignment accuracy between the plurality of trenches 9 and the plurality of trenches 10. As a result, the productivity can be improved.

Furthermore, irrespective of the pitch dimension of the plurality of trenches 9, the pitch dimension of the plurality of trenches 10 can be configured. That is, irrespective of the pitch dimension of the plurality of trench gate electrodes 3, the pitch dimension of the plurality of trench source electrodes 6a can be configured. Thus, for the plurality of trench gate electrodes 3 and the plurality of trench source electrodes 6a, respective optimal pitch dimensions can be configured.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Moreover, above-mentioned embodiments can be combined mutually and can be carried out.

What is claimed is:

1. A semiconductor device, comprising:
   a first semiconductor layer of a first conductivity type;
   a second semiconductor layer of the first conductivity type provided in a surface region of the first semiconductor layer;
   a first electrode extending in a first direction and provided inside a first trench, the first trench extending in the first direction and being opened to a surface of the second semiconductor layer; and
   a second electrode extending in a second direction crossing the first direction, and provided in a second trench, the second trench extending in the second direction and being opened to the surface of the second semiconductor layer, a dimension from the surface of the second semiconductor layer to a lower end of the second electrode being shorter than a dimension from the surface of the second semiconductor layer to a lower end of the first electrode.

2. The device according to claim 1, wherein the first electrode is provided in a plurality with a prescribed spacing.

3. The device according to claim 1, wherein the second electrode is provided in a plurality with a prescribed spacing.

4. The device according to claim 1, wherein an upper end of the first electrode is exposed to the surface of the second semiconductor layer.

5. The device according to claim 1, further comprising:
   a third electrode provided on the second semiconductor layer and electrically connected to the first electrode.

6. The device according to claim 1, further comprising:
   an insulating film provided inside the first trench and covering a side surface and a lower surface of the first electrode.

7. The device according to claim 1, further comprising:
   an insulating film provided inside the second trench and covering the second electrode.

8. The device according to claim 1, wherein an impurity concentration of the second semiconductor layer is higher than an impurity concentration of the first semiconductor layer.

9. The device according to claim 1, wherein an impurity concentration of the first semiconductor layer is $1\times10^{17}$ cm$^{-3}$ or less.

10. The device according to claim 1, wherein an impurity concentration of the second semiconductor layer is $1\times10^{19}$ cm$^{-3}$ or more.

11. The device according to claim 1, further comprising:
    a third semiconductor layer of a second conductivity type provided between the first semiconductor layer and the second semiconductor layer.

12. The device according to claim 1, further comprising:
    an insulating film provided inside the first trench and covering the first electrode.

* * * * *